United States Patent
Lee et al.

(10) Patent No.: US 11,424,387 B2
(45) Date of Patent: Aug. 23, 2022

(54) MICRO LIGHT EMITTING DIODE CHIP AND METHOD FOR MANUFACTURING MICRO LIGHT EMITTING DIODE DEVICE INCLUDING THE SAME

(71) Applicant: XIAMEN SANAN OPTOELECTRONICS TECHNOLOGY CO., LTD., Fujian (CN)

(72) Inventors: Chia-En Lee, Fujian (CN); Chen-Ke Hsu, Fujian (CN); Zheng Wu, Fujian (CN)

(73) Assignee: XIAMEN SANAN OPTOELECTRONICS TECHNOLOGY CO., LTD., Fujian (CN)

( * ) Notice: Subject to any disclaimer, the term of this patent is extended or adjusted under 35 U.S.C. 154(b) by 95 days.

(21) Appl. No.: 16/818,872

(22) Filed: Mar. 13, 2020

(65) Prior Publication Data

US 2020/0220047 A1 Jul. 9, 2020

Related U.S. Application Data

(63) Continuation-in-part of application No. PCT/CN2017/101860, filed on Sep. 15, 2017.

(51) Int. Cl.
*H01L 33/38* (2010.01)
*H01L 21/66* (2006.01)

(52) U.S. Cl.
CPC .............. *H01L 33/38* (2013.01); *H01L 22/32* (2013.01); *H01L 2933/0016* (2013.01)

(58) Field of Classification Search
CPC . H01L 33/38; H01L 22/32; H01L 2933/0016; H01L 2933/0066; H01L 25/0753; H01L 33/62; G01R 31/2635
See application file for complete search history.

(56) References Cited

U.S. PATENT DOCUMENTS 7,166,483 B2 * 1/2007 Liu .................. H01L 33/38
438/29
9,595,639 B2 * 3/2017 Song ................ H01L 33/38
(Continued)

FOREIGN PATENT DOCUMENTS

CN 102683529 A 9/2012
CN 103887407 A 6/2014
(Continued)

OTHER PUBLICATIONS

Search Report issued to PCT application No. PCT/CN2017/101860 by the CNIPA dated Jun. 20, 2018.
(Continued)

*Primary Examiner* — Su C Kim

(74) *Attorney, Agent, or Firm* — Muncy, Geissler, Olds & Lowe, P.C.

(57) ABSTRACT

A micro-LED chip includes an epitaxial layered structure, and first and second electrodes. The epitaxial layered structure includes first-type and second-type semiconductor layers, and a light emitting layer sandwiched therebetween. The first and second electrodes are electrically connected to the first-type and second-type semiconductor layers, respectively. The micro-LED chip has a first distinctive region on an electrode surface of the first electrode. The first distinctive region has a surface morphology different from that of an adjacent region of the electrode surface of the first electrode. A method for manufacturing a micro-LED device including at least one micro-LED chip is also provided.

24 Claims, 18 Drawing Sheets

(56) References Cited

U.S. PATENT DOCUMENTS

2005/0211989 A1* 9/2005 Horio .................. H01L 33/46
257/79
2013/0292719 A1* 11/2013 Lee .................... H01L 27/156
257/93

FOREIGN PATENT DOCUMENTS

| CN | 106486577 A | 3/2017 |
| CN | 106816408 A | 6/2017 |

OTHER PUBLICATIONS

Search Report of corresponding CN Application No. 201780049112. 8, dated Mar. 3, 2021, 1 page.

* cited by examiner

MICRO LIGHT EMITTING DIODE CHIP AND METHOD FOR MANUFACTURING MICRO LIGHT EMITTING DIODE DEVICE INCLUDING THE SAME

CROSS-REFERENCE TO RELATED APPLICATION

This application is a continuation-in-part (CIP) application of International Application No. PCT/CN2017/101860 filed on Sep. 15, 2017.

FIELD

The disclosure relates to a micro light emitting diode (micro-LED) device including a micro-LED chip and a method for manufacturing the same.

BACKGROUND

The technology of microscopic devices refers to the formation of arrays of micro-sized devices on a substrate in a compact and integrated manner. Such micro-sized devices include, for example, microswitches in micro-electromechanical systems (MEMS), light emitting diode (LED) display devices, and MEMS-based or quartz-based crystal oscillators. Among the LED display devices, micro-LED chips exhibiting outstanding qualities such as high luminance, low power consumption, high resolution, and high color saturation, are the focus of research and development.

However, it is difficult to probe the micro-LED chips due to small size thereof. That is, the electrodes on the micro-LED chips are so small that the probe may not be accurately positioned on the electrodes for testing. Furthermore, for low current measurement, the low luminance of a single micro-LED chip takes longtime to be measured and is prone to large measurement error.

SUMMARY

Therefore, an object of the disclosure is to provide a micro-LED chip and a method for manufacturing a micro-LED device including at least one micro-LED chip, which can alleviate at least one of the drawbacks of the prior art.

According to one aspect of the present disclosure, the micro-LED chip includes an epitaxial layered structure, a first electrode and a second electrode. The epitaxial layered structure includes a first-type semiconductor layer, a second-type semiconductor layer, and a light emitting layer sandwiched between the first-type semiconductor layer and the second-type semiconductor layer. The first electrode is electrically connected to the first-type semiconductor layer, and the second electrode is electrically connected to the second-type semiconductor layer. The micro-LED chip has a first distinctive region on an electrode surface of the first electrode opposite to the first-type semiconductor layer. The first distinctive region has a surface morphology different from that of an adjacent region of the electrode surface of the first electrode.

According to another aspect of the present disclosure, the method for manufacturing a micro-LED device including at least one micro-LED chip includes the steps of:

providing an epitaxial layered structure that includes a first-type semiconductor layer, a light emitting layer and a second-type semiconductor layer which are sequentially disposed on one another in such order along a laminating direction;

forming a first electrode electrically connected to the first-type semiconductor layer, and forming a second electrode electrically connected to the second-type semiconductor layer so as to obtain the micro-LED chip, the first electrode having an electrode surface that is opposite to the first-type semiconductor layer; and forming a first distinctive region on an electrode surface of the first electrode opposite to the first-type semiconductor layer, the first distinctive region having a surface morphology different from that of an adjacent region of the electrode surface of the first electrode.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
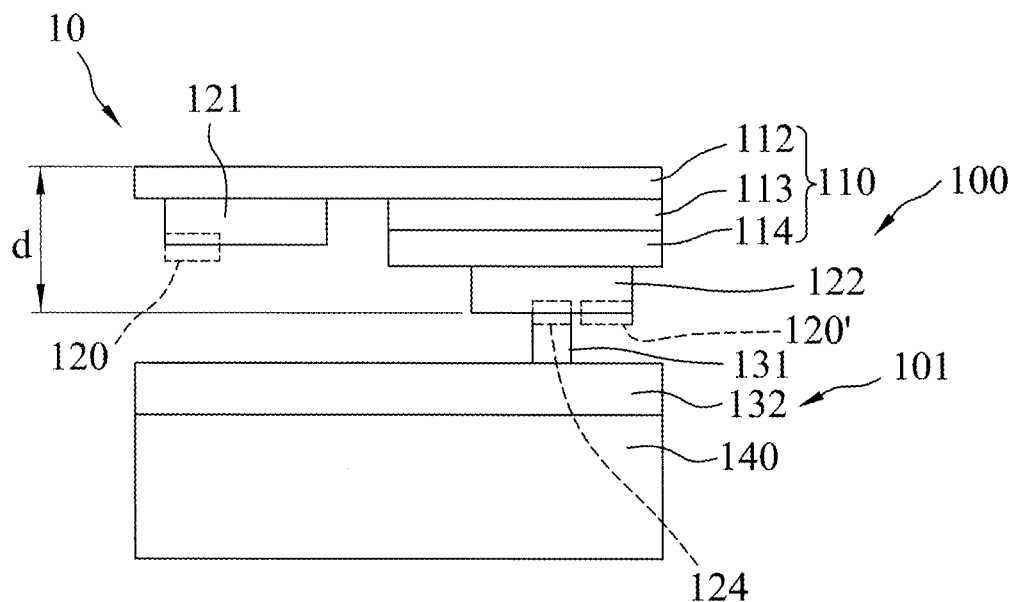
FIG. 1 is a schematic view illustrating a micro-LED device including at least one of a first embodiment of a micro-LED chip according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a micro-LED device 10 according to the disclosure is provided and includes a first embodiment of a micro-LED chip 100, which is exemplified as a flip chip, and a support member 101. The micro-LED chip 100 includes an epitaxial layered structure 110, a first electrode 121 and a second electrode 122.

The micro-LED chip 100 may be a thin film structure. In this embodiment, the micro-LED chip 100 has a size that is equal to or smaller than 100 μm×100 μm, such as 100 μm×100 μm, 100 μm×50 μm, 50 μm×50 μm, 20 μm×10 μm, or 10 μm×10 μm according to practical application. In addition, the micro-LED chip 100 may have a thickness (d) that is equal to or smaller than 20 μm, such as 15 μm or 10 μm.

The epitaxial layered structure 110 includes a first-type semiconductor layer 112, a second-type semiconductor layer 114, and a light emitting layer 113 sandwiched between the first-type semiconductor layer 112 and the second-type semiconductor layer 114.

The term "first-type" refers to being doped with a first type dopant, and the term "second-type" refers to being doped with a second type dopant that is opposite in conductivity to the first type dopant. For instance, the first type dopant may be an n-type dopant, and the second type dopant may be a p-type dopant, and vice versa.

The light emitting layer 113 is disposed on a semiconductor surface of the first-type semiconductor layer 112. The light emitting layer 113 may be one of an intrinsic semiconductor layer, a p-type semiconductor layer and an n-type semiconductor layer, and may be excited by an electrical current passing through the epitaxial layered structure 110 to emit light. In certain embodiments, the light emitting layer 113 is made of nitride-based material, which is utilized to emit blue, green or ultraviolet light. Alternatively, the light emitting layer 113 may be made of aluminium gallium indium phosphide-based material, which is utilized to emit red, orange or yellow light.

The first electrode 121 is formed on the semiconductor surface of the first-type semiconductor layer 112 (i.e., the light emitting layer 113 and the first electrode 121 are spaced apart from each other), and is electrically connected to the first-type semiconductor layer 112. The second electrode 122 is formed on and electrically connected to the second-type semiconductor layer 114.

In this embodiment, the first and second electrodes 121, 122 and a supporter 131 are located on the same side of the epitaxial layered structure 110 so that the light can be emitted from the opposite side of the epitaxial layered structure 110, thereby increasing the area for emitting light and provides convenience for subsequent packaging process.

Figure 2:
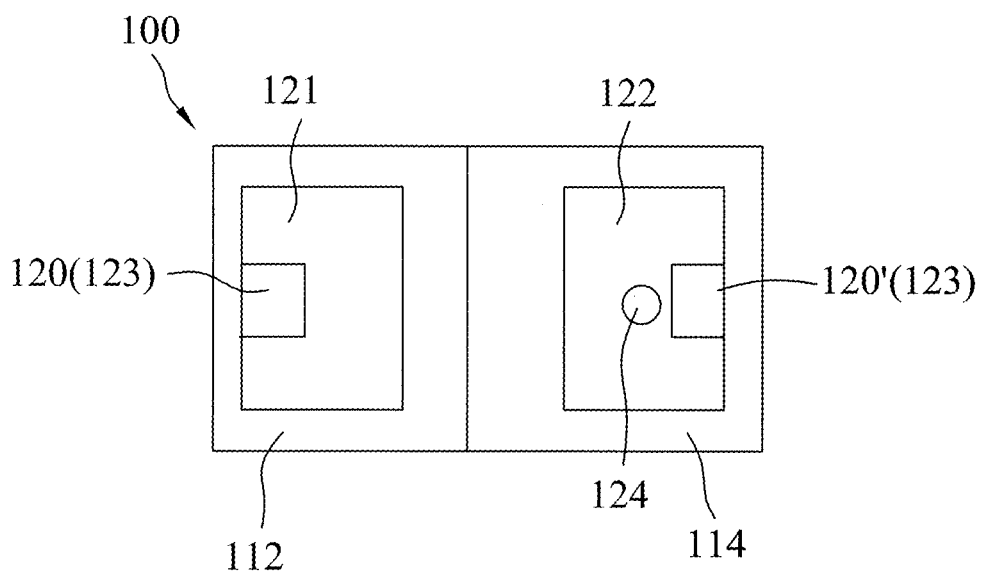
FIG. 2 is a bottom view of the first embodiment of the micro-LED chip of FIG. 1.
Figure 3:
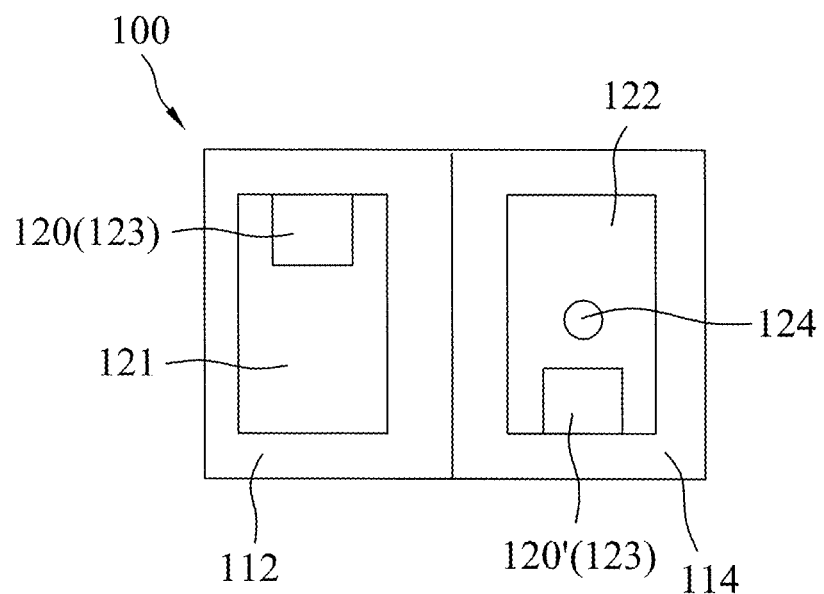
FIGS. 3 to 6 are bottom views illustrating variations of the first embodiment of the micro-LED chip.
Figure 4:
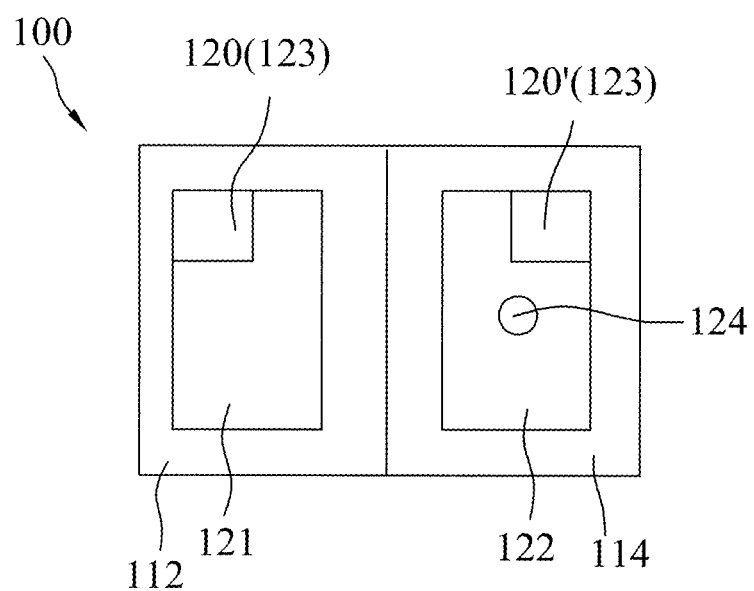
Figure 5:
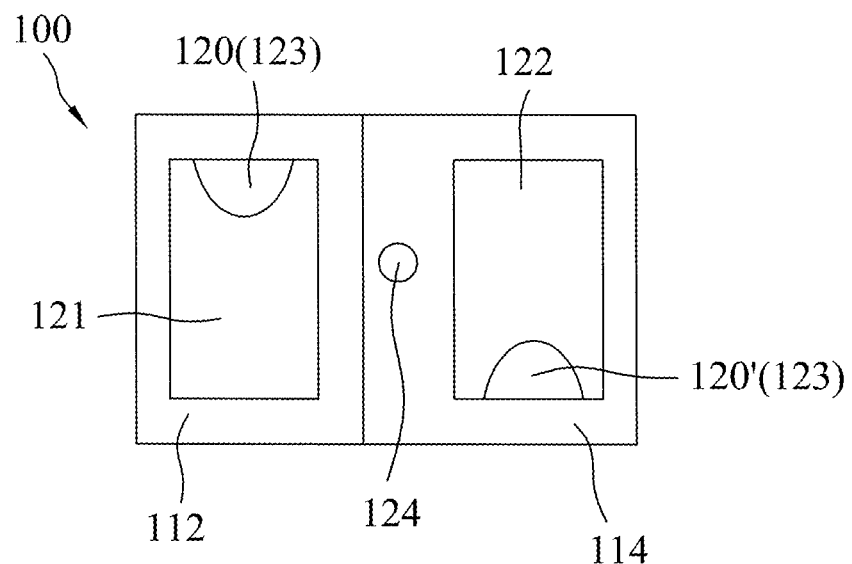
Figure 6:
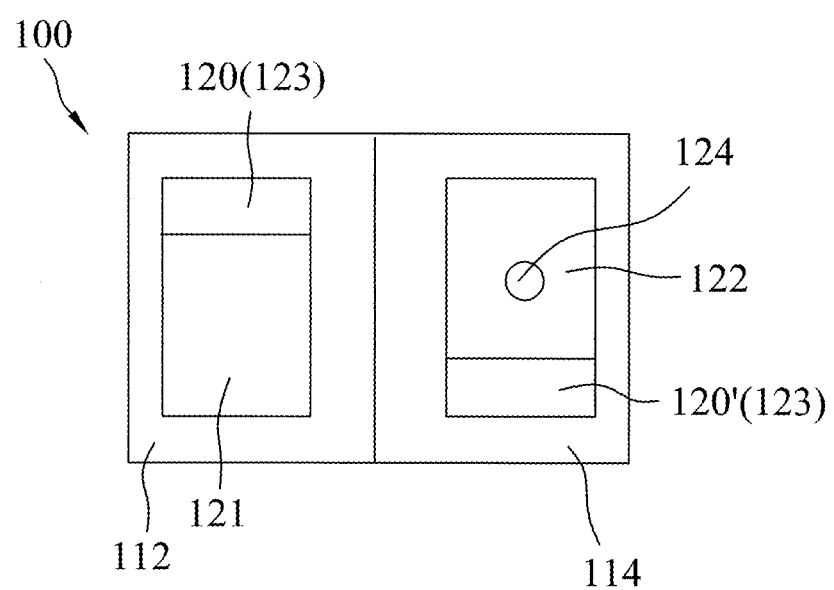

Referring to FIG. 2, the micro-LED chip 100 has a first distinctive region 120 formed on an electrode surface of the first electrode 121 opposite to the first-type semiconductor layer 112. The first distinctive region 120 has a surface morphology different from that of an adjacent region of the electrode surface of the first electrode 121. The micro-LED chip 100 further has a second distinctive region 120' on an electrode surface of the second electrode 122 opposite to the first-type semiconductor layer 112. The second distinctive region 120' has a surface morphology different from that of an adjacent region of the electrode surface of the second electrode 122.

It is noted that since the micro-LED chip 100 is a micro-sized device and the first and second electrodes 121, 122 are of small size, test probes cannot be accurately positioned on these electrodes to test the electrical and optical properties of the micro-LED chip 100. To improve the positional accuracy of the test probes, each of the electrode surfaces of the first and second electrodes 121, 122 has a wire connecting region 123 for a metal wire 171 formed thereon to electrically connect the first and second electrodes 121, 122 to a test electrode unit 180 so as to test the electrical and optical properties of the micro-LED chip 100 (see FIGS. 13 to 15).

In one aspect, after completing the test of the electrical and optical properties, the metal wire 171 is completely removed such that the wire connecting regions 123 of the electrode surfaces of the first and second electrodes 121, 122 are formed into the first and second distinctive regions 120, 120', respectively. That is, the first and second distinctive regions 120 and 120' are regions of the electrode surfaces of the first and second electrodes 121, 122 and are formed by removing the metal wire 171 disposed thereon using, for example, wet etching technique. The metal wire 171 is made of a material different from that of the first and second electrodes 121, 122. In this way, the surface morphology (such as color) of the first and second distinctive regions 120 and 120' may be different from that of the adjacent regions of the electrode surfaces of the first and second electrodes 121, 122 due to etching.

In another aspect, after completing the test of the electrical and optical properties, the metal wire 171 is partially removed such that the metal wire 171 on the wire connecting regions 123 of the first and second electrodes 121, 122 remains thereon. That is, the micro-LED chip 100 may further include the metal wire 171 that is formed on each of the wire connecting regions 123, and that is formed as the first and second distinctive regions 120 and 120' of the micro-LED chip 100. As such, the surface morphology of the first and second distinctive regions 120 and 120' is clearly different from that of the adjacent regions of the electrode surfaces of the first and second electrodes 121, 122 without the metal wire 171 disposed thereon.

The wire connecting regions 123 of the first and second electrodes 121, 122 may independently have a shape of one of polygon, circle, semi-circle and other irregular forms. In this embodiment, each of the wire connecting regions 123 is in a rectangular form.

The wire connecting regions 123 of the first electrode 121 (or the first distinctive regions 120) may have an area that is equal to or more than 5% (e.g., 10% to 30%) of a total area of the electrode surface of the first electrode 121. The wire connecting regions 123 of the second electrode 122 (or the second distinctive regions 120') may have an area that is equal to or more than 5% (e.g., 10% to 30%) of a total area of the electrode surface of the second electrode 122.

A total area of a projection of the first electrode 121 on the first-type semiconductor layer 112 and a projection of the second electrode 122 on the first-type semiconductor layer 112 is not smaller than 40% of an area of a projection of the micro-LED chip 100 on an imaginary plane parallel to the semiconductor surface of the first-type semiconductor layer 112.

The support member 101 includes a carrier substrate 140, a securing layer 132 formed on the carrier substrate 140, and at least one supporter 131 connecting the epitaxial layered structure 110 to the carrier substrate 140. The supporter 131 may be made of thermosetting material, which includes, but is not limited to, benzocyclobutene (BCB) and an epoxy resin. The supporter 131 of the support member 101 may be disposed at different locations on the micro-LED chip 100, for example, a region between the first and second electrodes 121, 122, on the first electrode 121, and/or on the second electrode 122. In certain embodiments, at least one of the first electrode 121 and the second electrode 122 has a supporter connecting region 124 that is connected to the supporter 131 of the support member 101 for pick-up operation. In this embodiment, the second electrode 122 has the supporter connecting region 124 that is spaced apart from the wire connecting region 123. The supporter connecting region 124 may have an area that is equal to or smaller than 10% (e.g. 5%) of an area of the corresponding one of the first electrode 121 and the second electrode 122. The supporter 131 is connected to the carrier substrate 140 via the securing layer 132. The securing layer 132 may be made of the same material as the supporter 131, and maybe formed integrally with the supporter 131.

FIGS. 3 to 6 illustrates different patterns of the wire connecting regions 123 (i.e., the first and distinctive regions 120, 120') and the supporter connecting region 124 on the first and second electrodes 121, 122 in variations of the first embodiment of the micro-LED chip 100. In these variations, the first distinctive region 120 and the second distinctive region 120' are respectively positioned at the edge of the first electrode 121 and the second electrode 122. In addition, the supporter connecting region 124 may be positioned between the first and second electrodes 121, 122 (e.g., on the second-type semiconductor layer 114), and the wire connecting regions 123 may be in a semi-circle form (see FIG. 5).

Referring to FIGS. 7 to 19, a first embodiment of a method for manufacturing a micro-LED device 10 including at least one of the first embodiment of the micro-LED chips 100 according to the disclosure includes the following steps (a) to (c).

Figure 7:
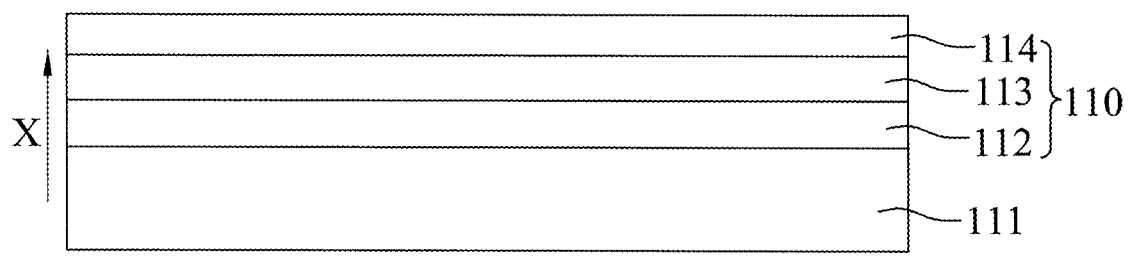
FIGS. 7 to 19 are schematic views illustrating consecutive steps of a first embodiment of a method for manufacturing the micro-LED device of FIG. 1 according to the disclosure.
Figure 8:
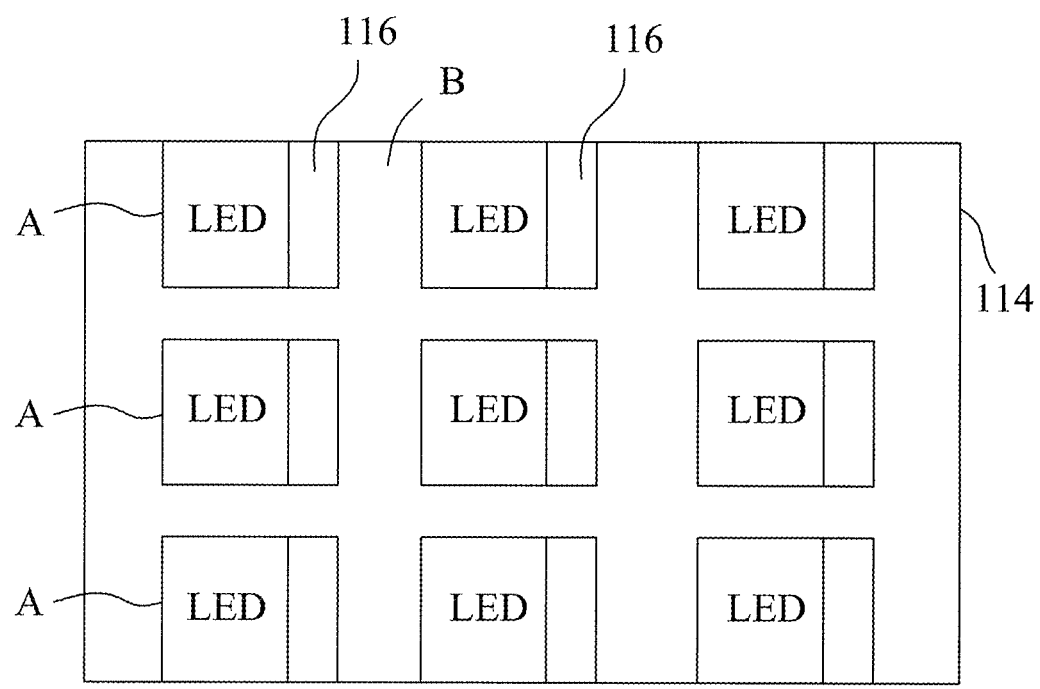

Referring to FIG. 7, in step (a), an epitaxial layered structure 110 is provided on a temporary substrate 111. The temporary substrate 111 may be made of a material selected from sapphire, aluminum nitride, gallium nitride, silicon, silicon carbide, gallium arsenide, etc. In certain embodiments, the temporary substrate 111 may have a planar surface or a patterned surface. The epitaxial layered structure 110 includes a first-type semiconductor layer 112, a light emitting layer 113 and a second-type semiconductor layer 114 which are sequentially disposed on one another in such order along a laminating direction (X). The material and configuration of the epitaxial layered structure 110 can be modified and selected depending on practical requirements, and are not limited to those disclosed herein. In this embodiment, the micro-LED device 10 to be made includes a plurality of the micro-LED chips 100. Referring to FIG. 8, the epitaxial layered structure 110 has a plurality of spaced apart micro LED regions (A) that are arranged in an array and a cutting region (B) that surrounds and separates the micro LED regions (A).

In step (b), a first electrode 121 is formed on and electrically connected to the first-type semiconductor layer 112, and a second electrode 122 is formed on and electrically connected to the second-type semiconductor layer 114. In this embodiment, step (b) includes sub-steps (b1) to (b3).

Figure 9:
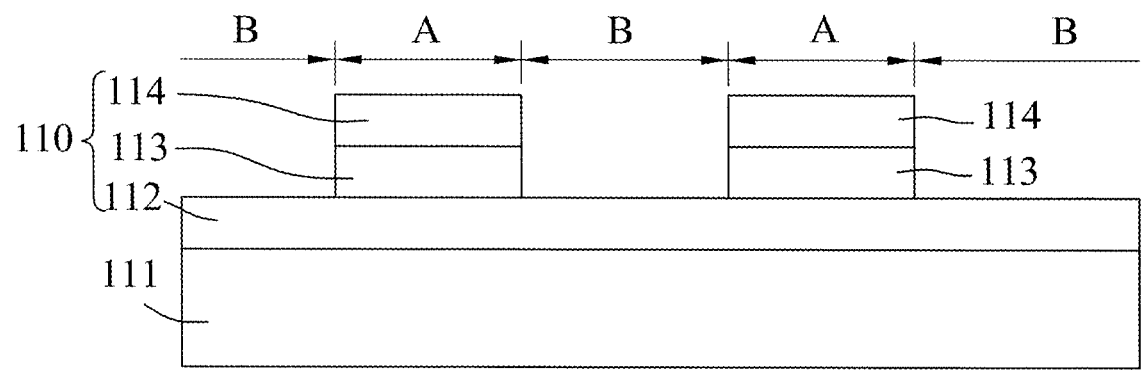

As shown in FIG. 9, in sub-step (b1), a portion of the second-type semiconductor layer 114 and a portion of the light emitting layer 113 in each of the micro-LED regions (A) are etched to expose the first-type semiconductor layer 112.

Figure 10:
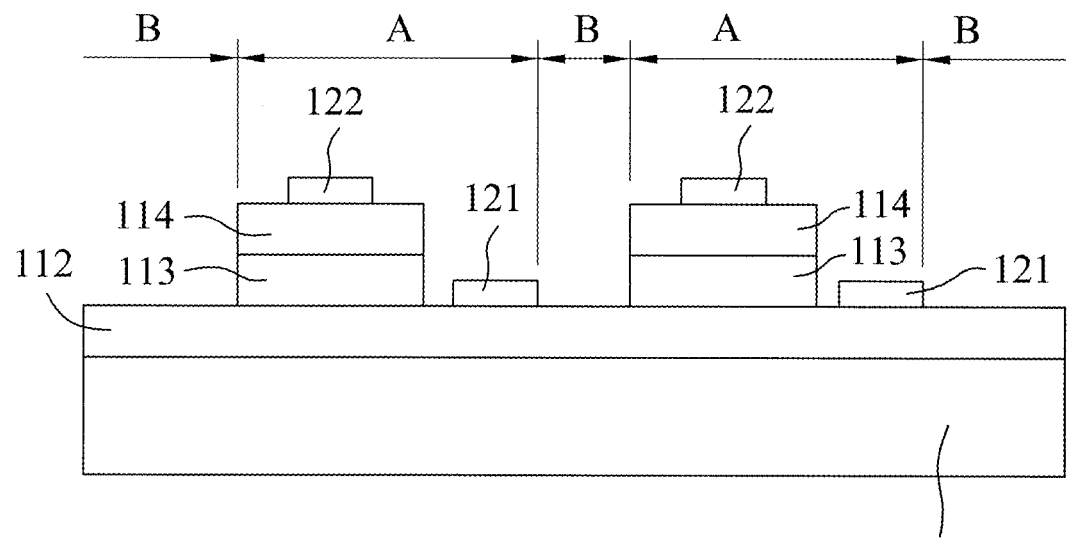

In sub-step (b2), referring to FIG. 10, in each of the micro-LED regions (A), the first electrode 121 is formed on and electrically connected to the first-type semiconductor layer 112, and the second electrode 122 is formed on and electrically connected to the second-type semiconductor layer 114. Each of the first and second electrodes 121, 122 has an electrode surface that is opposite to the first-type semiconductor layer 112.

Figure 11:
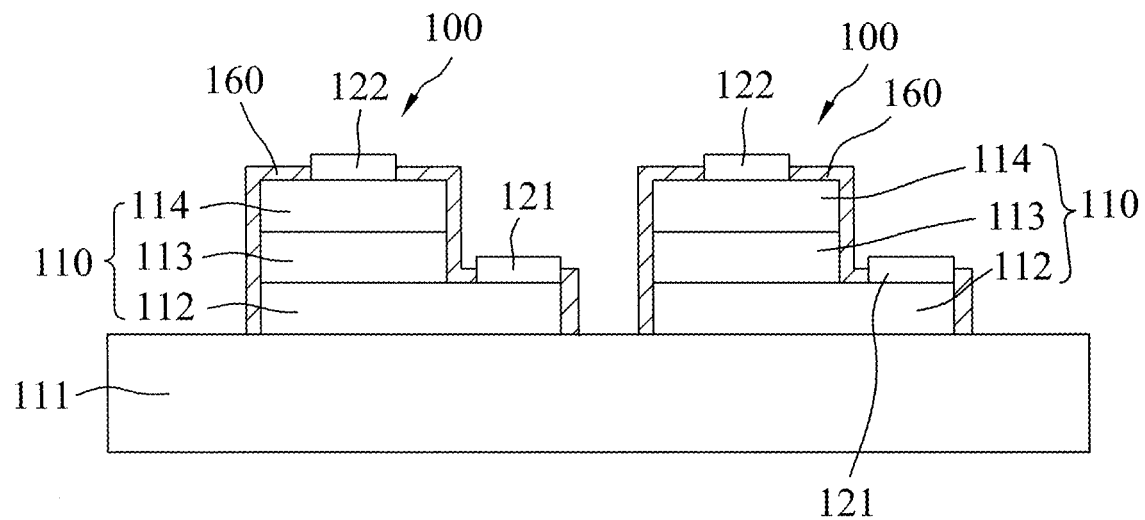

Referring to FIG. 11, in sub-step (b3), the second-type semiconductor layer 114, the light emitting layer 113 and the first-type semiconductor layer 112 in the cutting region (B) are etched to expose the temporary substrate 111, so as to obtain the micro-LED chips 100 that are separated from one another. It should be noted that, the second-type semiconductor layer 114 and the light emitting layer 113 in the cutting region (B) may be first etched in sub-step (b1), and then in sub-step (b3), only the first-type semiconductor layer 112 in the cutting region (B) is etched.

In this embodiment, an insulating protective layer 160 covers a periphery of each of the micro-LED chips 100 such that the electrode surfaces of the first and second electrodes 121, 122 are exposed. The insulating protective layer 160 may be transparent and may be made of $SiN_x$ (x is 1 or 2) or $SiO_2$.

In certain embodiments, in each of the micro-LED chips 100, an extended electrode is formed on each of the first and second electrodes 121, 122 and extends along the insulating protective layer 160. For convenient packaging, the extended electrode of the first electrode 121 may be flushed with the extended electrode of the second electrode 122.

In step (c), a first distinctive region 120 is formed on the electrode surface of the first electrode 121 opposite to the first-type semiconductor layer 112, and a second distinctive region 120' is formed on the second electrode 122. The first distinctive region 120 has a surface morphology different from that of an adjacent region of the electrode surface of the first electrode 121. The second distinctive region 120' has a surface morphology different from that of an adjacent region of the electrode surface of the second electrode 122.

Figure 12:
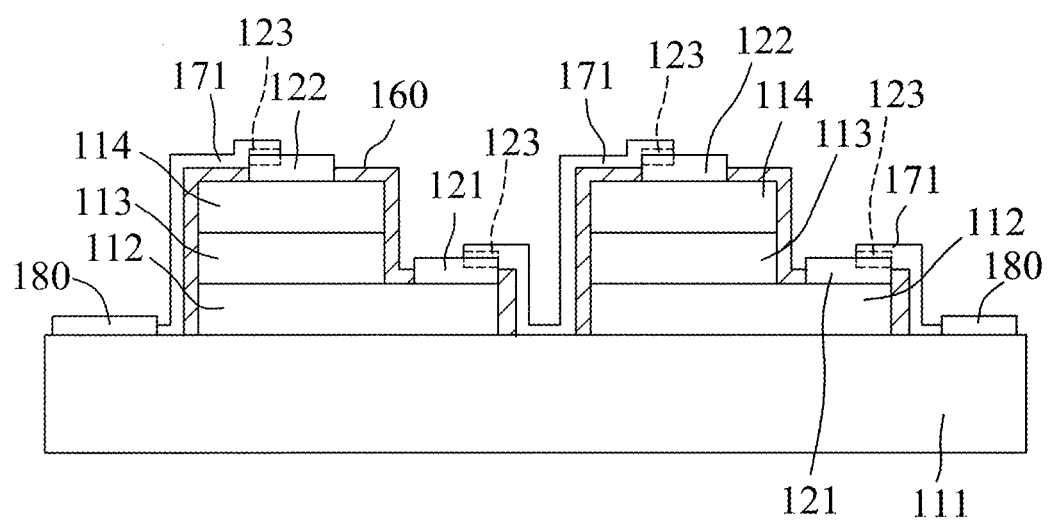

To be specific, referring to FIG. 12, each of the electrode surfaces of the first and second electrodes 121, 122 has a wire connecting region 123, and step (c) includes sub-step (c1), in which a metal wire 171 is disposed on the wire connecting regions 123 and at least one of the micro-LED chips 100 is connected to a test electrode unit 180 located on the temporary substrate 111 corresponding in position to the cutting region (B) through the metal wire 171. The metal wire 171 is made of a metal material same as or different from that of the first and second electrodes 121, 122. The size of the test electrode unit 180 can be determined based on the space between two adjacent ones of the micro-LED chips 100. In certain embodiments, the size of the test electrode unit 180 is equal to or greater than 100 μm.

Figure 13:
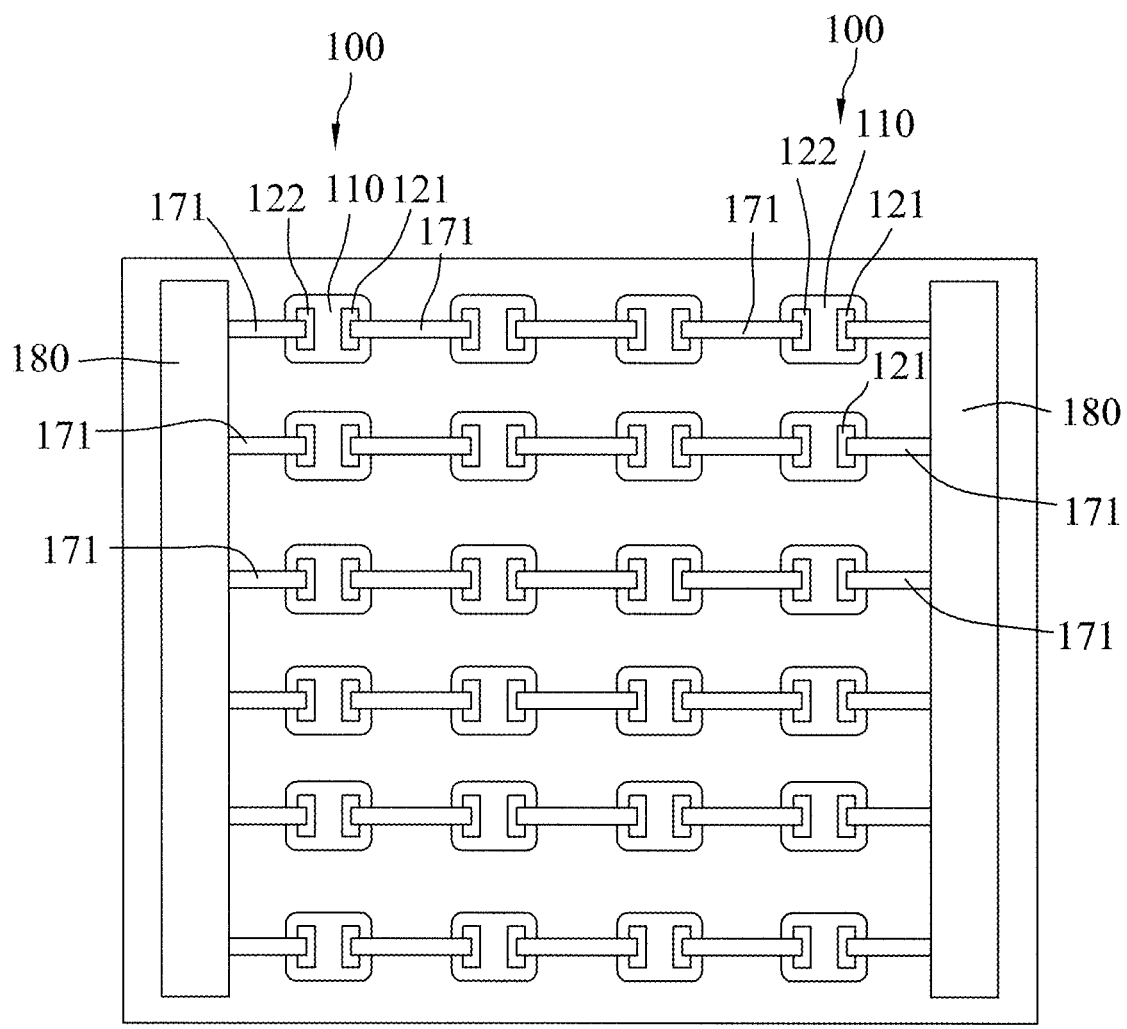

The test electrode unit 180 may include a plurality of test electrodes arranged at both sides of an array of the micro-LED chips 100. As shown in FIG. 13, the second electrodes 122 of the micro-LED chips 100 on the leftmost column are connected to one test electrode of the test electrode unit 180 through the metal wire 171, and the first electrodes 121 of the micro-LED chips 100 on the rightmost column are connected to the other one test electrode of the test electrode unit 180 through the metal wire 171. In addition, two adjacent ones of the micro-LED chips 100 on the same row are connected to each other. That is, the first electrode 121 of one of the two adjacent ones of the micro-LED chips 100 is connected to the second electrode 122 of the other one of the two adjacent ones of the micro-LED chips 100.

Figure 14:
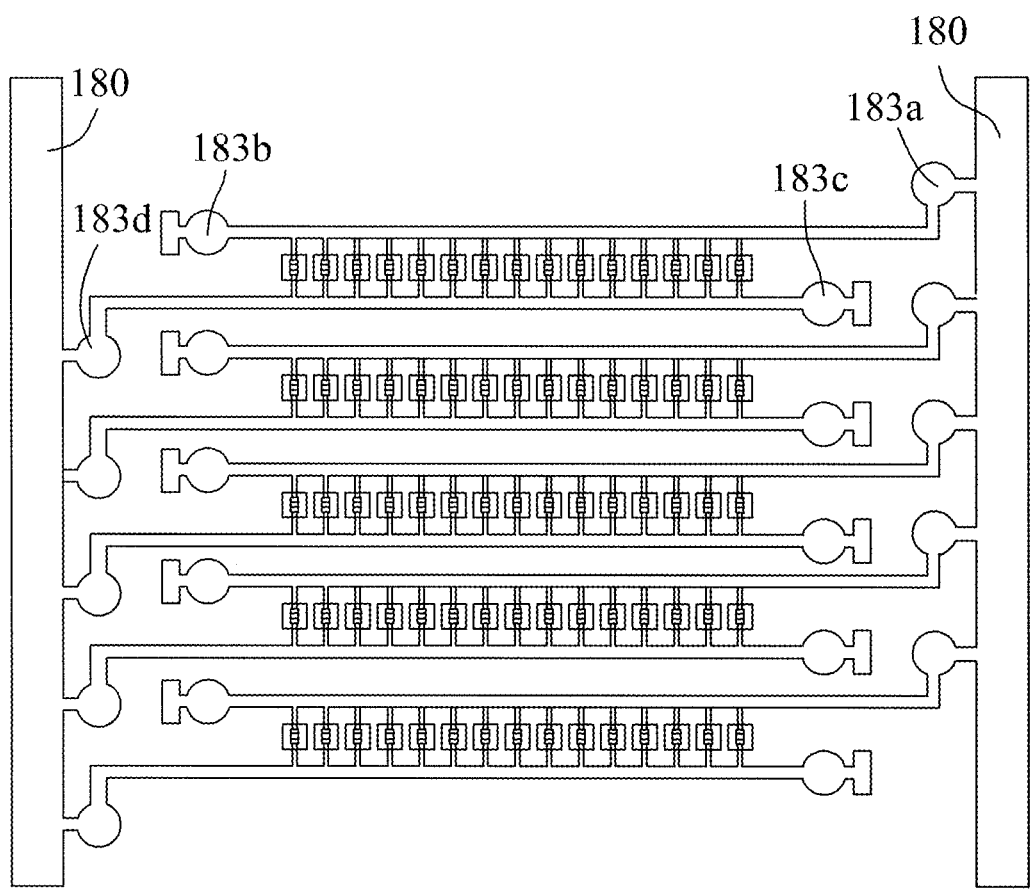
Figure 15:
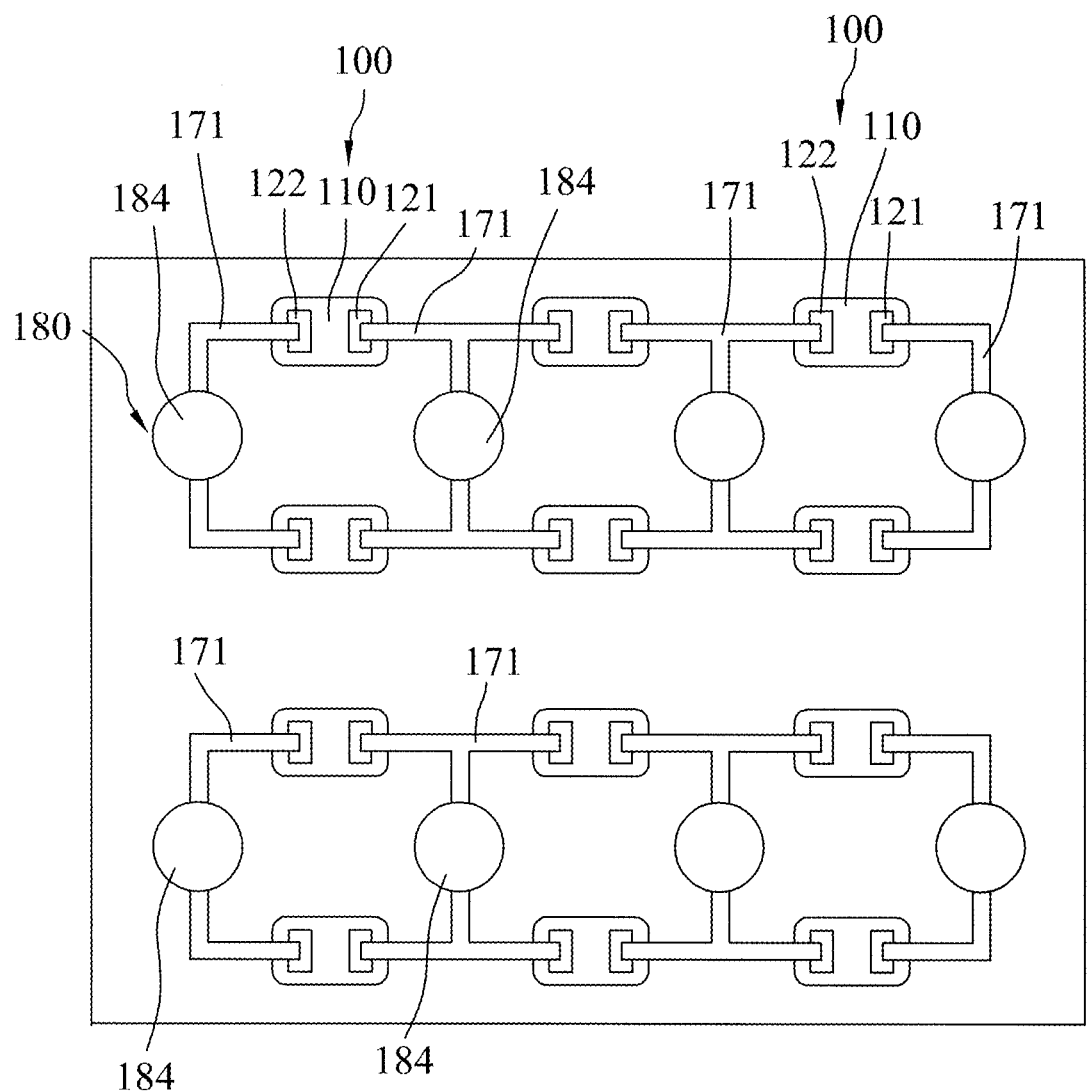

FIGS. 14 and 15 show different patterns of test circuit for the micro-LED chips 100. As shown in FIG. 14, spare test electrodes 183a to 183d are provided to prevent the breakdown of the test electrode unit 180. As shown in FIG. 15, the test electrode unit 180 includes multiple guide electrodes 184 to electrically connect the adjacent ones of the micro-LED chips 100. To be specific, the first and second electrodes 121, 122 of each of the micro-LED chips 100 are electrically connected to two adjacent ones of the guide electrodes 184 through the metal wire 171, and six micro-LED chips 100 are interconnected with four guide electrodes 184. In this manner, the micro-LED chips 100 can be individually tested.

It should be noted that, it is not necessary to connect each of the micro-LED chips 100 to the test electrode unit 180 for testing. If the micro-LED device 10 has uniform characteristics, the test electrode unit 180 may only be provided in certain regions of the micro-LED chips 100, and the quality of all of the micro-LED chips 100 on the micro-LED device 10 may be determined from the testing result for the micro-LED chips 100 in those regions.

After completing the test of the electrical and optical properties, sub-step (c2) of step (c) is performed, in which the first electrode 121 and the test electrode unit 180 are disconnected by removing at least a part of the metal wire 171 between the first electrode 121 and the test electrode unit 180.

The method of this disclosure may further include step (d) of forming a securing layer 132 that has at least one supporter 131 connected to at least one of the first electrode 121 and the second electrode 122. Sub-step (c2) and step (d) are specifically described as follows.

Figure 16:
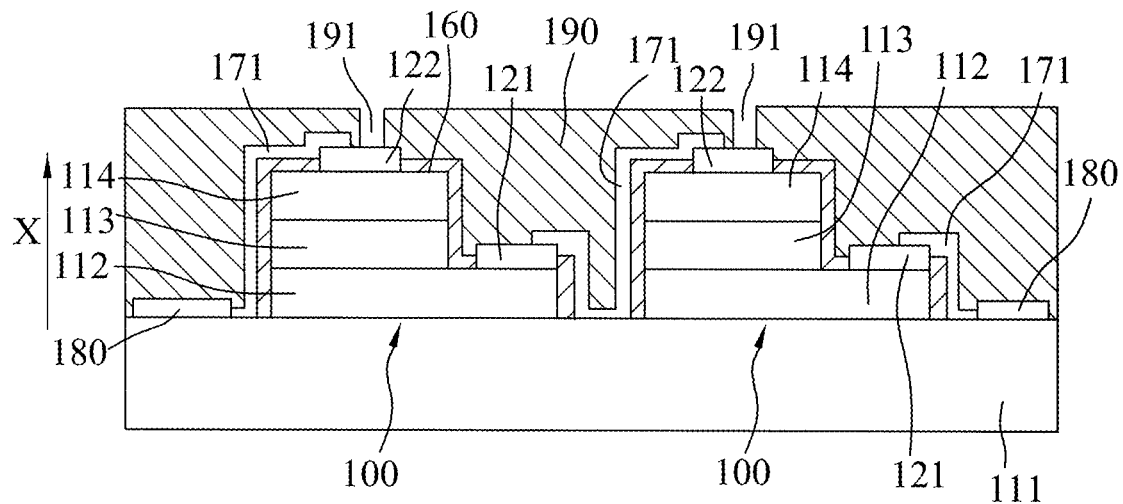

Referring to FIG. 16, a sacrificial layer 190 is formed on the second electrode 122 of each of the micro-LED chips 100 in the laminating direction (X). For each of the micro-LED chips 100, the sacrificial layer 190 has through-holes 191 to expose the second electrode 122. The sacrificial layer 190 may have a thickness ranging from 0.1 μm to 5 μm, and may be made of an oxide, a nitride or other materials that can be selectively removed relative to other layers in the micro-LED device 10.

Figure 17:
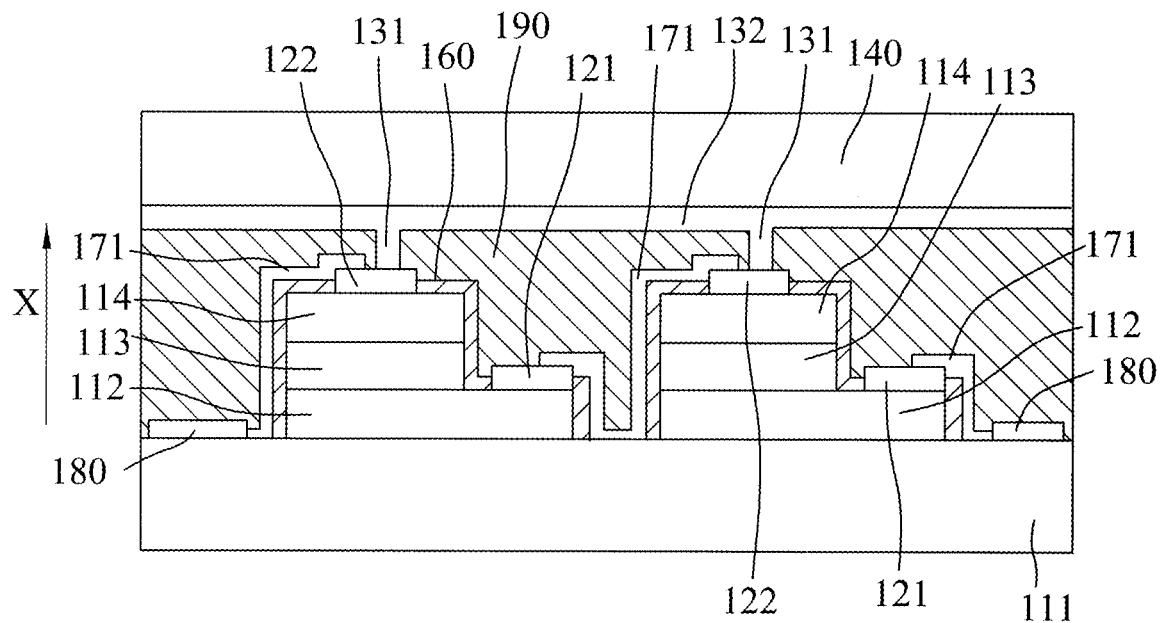

Thereafter, referring to FIG. 17, a carrier substrate 140 is provided to be spaced apart from the epitaxial layered structure 110 in the laminating direction (X), and a securing layer 132 is formed between the epitaxial layered structures 110 of the micro-LED chips 100 and the carrier substrate 140. The securing layer 132 fills each of the through-holes 191 of the sacrificial layer 190 to form a corresponding one of the supporters 131 that connect the epitaxial layered structures 110 of each of the micro-LED chips 100 to the carrier substrate 140.

Figure 18:
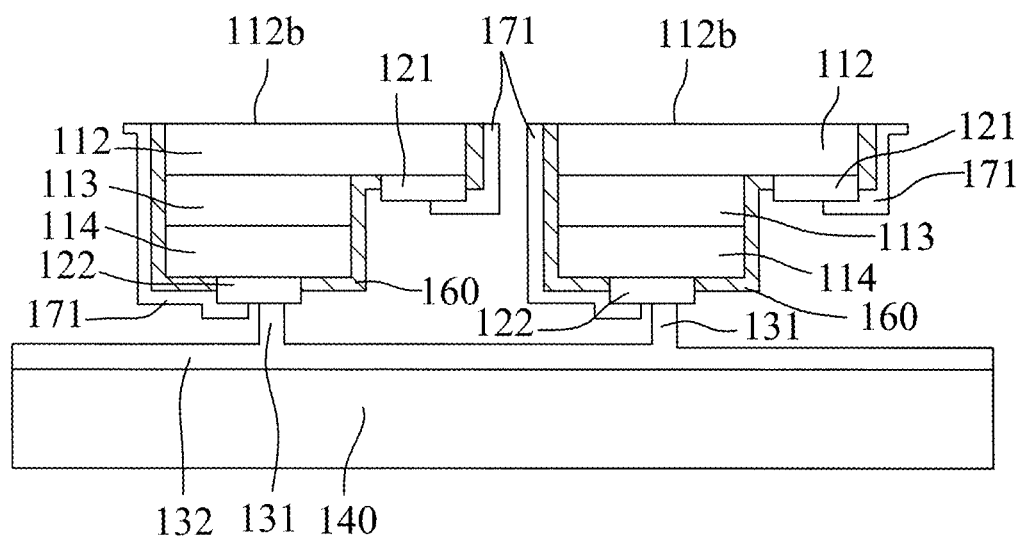
Figure 19:
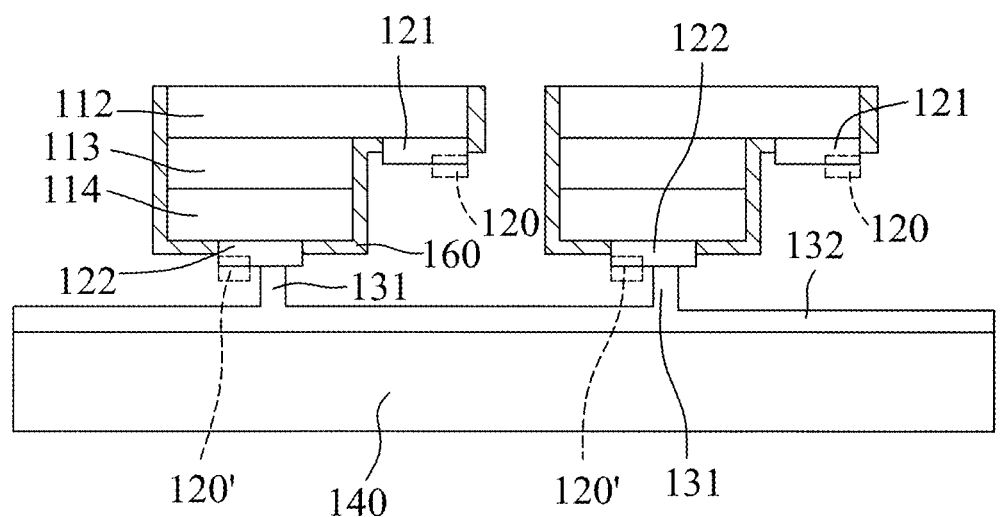

Referring to FIG. 18, the temporary substrate 111 is removed to expose the first-type semiconductor layer 112. The removal of the temporary substrate 111 can be accomplished by laser lift off (LLO), grinding or etching based on the material of the temporary substrate 111. With the removal of the temporary substrate 111, the metal wire 171 and the test electrode unit 180 on the temporary substrate 111 are also removed. Finally, the sacrificial layer 190 is removed such that the micro-LED chips 100 are supported on the carrier substrate 140 through the supporters 131 of the securing layer 132.

In certain embodiments, the metal wire 171 is made of a metal material different from that of the first and second electrodes 121, 122. For example, the first and second electrodes 121, 122 are made of Au or Al, and the metal wire 171 is made of TiW or Ni. Therefore, in step (c2), the metal wire 171 may be removed by selective etching. During the removal procedure, etching solution only reacts with the metal wire 171 and would not react with the first and second electrodes 121, 122. Therefore, the metal wire 171 can be completely removed such that the wire connecting regions 123 of the first and second electrodes 121, 122 are respectively formed into the first and second distinctive regions 120 and 120', which may have colors different from those of the remaining regions of the electrode surfaces of the first and second electrodes 121, 122. In addition, the integrity of the first and second electrodes 121, 122 can be maintained after the removal procedure (see FIG. 19).

In certain embodiments, the metal wire 171 is partially removed such that the metal wire 171 remaining on the wire connecting regions 123 of the first and second electrodes 121, 122 are formed as the first and second distinctive regions 120, 120' that has a surface morphology different from that of the remaining regions of the electrode surfaces of the first and second electrodes 121, 122 (see FIG. 18).

In certain embodiments, the metal wire 171 and the sacrificial layer 190 are made of a same material that is selected from TiW and Ni. In this case, sub-step (c2) is conducted after step d), and the metal wire 171 and the sacrificial layer 190 are simultaneously removed.

Alternatively, the material of the first and second electrodes 121, 122, the metal wire 171 and the sacrificial layer 190 are different from one another. For example, the material of the first and second electrodes 121, 122 is selected from Au and Al, the metal wire 171 is made of Ni, and the sacrificial layer 190 is made of TiW. Therefore, when the metal wire 171 and the sacrificial layer 190 are removed by etching, the first and second electrodes 121, 122 would not be removed.

The test of the micro-LED chips 100 may be performed after the support member 101 is formed. Therefore, the test of the micro-LED chips 100 can be performed on the side of the micro-LED chips 100 opposite to the first and second electrodes 121, 122. To be specific, the epitaxial layered structure 110 may further includes a buffer layer or an undoped semiconductor layer (not shown) formed between the temporary substrate 111 and the first-type semiconductor layer 112, and in sub-step (b3), the buffer layer or the undoped semiconductor layer in the cutting region (B) is exposed or partially removed so that the metal wire 171 and the test electrode unit 180 may be formed on the exposed portion of the buffer layer or the undoped semiconductor layer. During removal of the temporary substrate 111, the test electrode unit 180 and the metal wire 171 can be protected by the exposed portion of the buffer layer or the undoped semiconductor layer. Then, the sacrificial layer 190 is removed. After completing the testing of the electrical and optical properties, the metal wire 171 is removed by selective etching.

Figure 20:
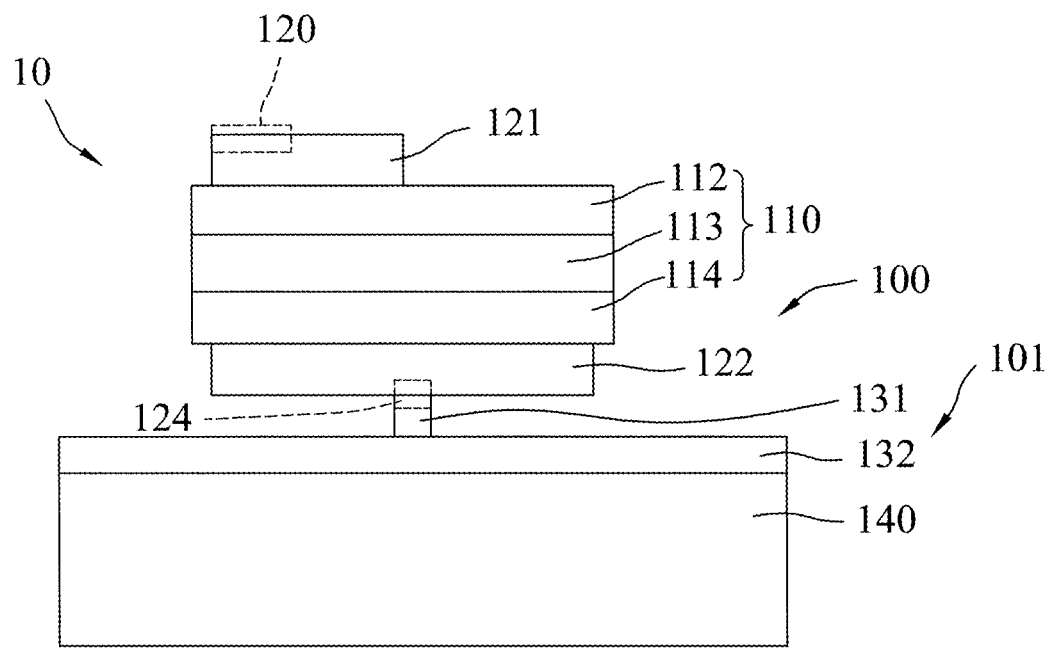
FIG. 20 is a schematic view illustrating a micro-LED device including at least one of a second embodiment of a micro-LED chip according to the disclosure.
Figure 21:
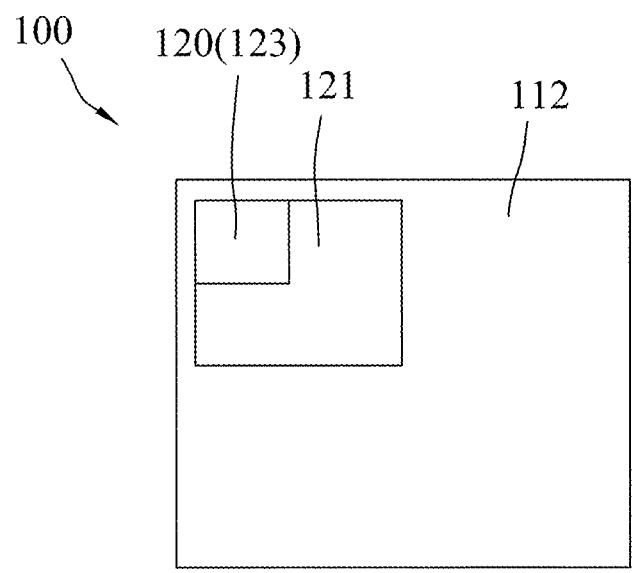
FIG. 21 is a top view of the second embodiment of the micro-LED chip of FIG. 20.

Referring to FIGS. 20 and 21, the micro-LED device 10 including a second embodiment of the micro-LED chip 100 is provided, which is generally similar to the first embodiment of the micro-LED chip 100, except for the following differences.

In this embodiment, the first electrode 121 is formed on a semiconductor surface of the first-type semiconductor layer 112 that is opposite to the light emitting layer 113. That is, the first and second electrodes 121, 122 are disposed on two opposite sides of the epitaxial layered structure 110.

In addition, only the first electrode 121 has the wire connecting region 123 for the metal wire 171 formed thereon to electrically connect the first electrode 121 to the test electrode unit 180 for testing the electrical and optical properties of the micro-LED chip 100.

Referring to FIGS. 22 to 33, a second embodiment of the method for manufacturing the micro-LED device 10 according to the disclosure is generally similar to the first embodiment of the method.

Figure 22:
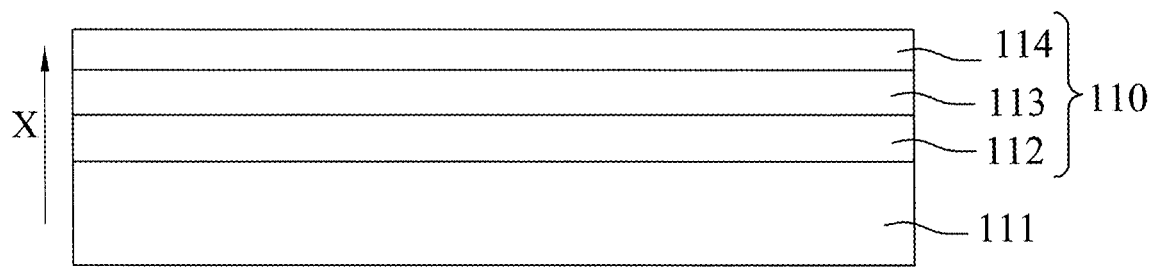
FIGS. 22 to 33 are schematic views illustrating consecutive steps of a second embodiment of a method for manufacturing the micro-LED device of FIG. 20 according to the disclosure.
Figure 23:
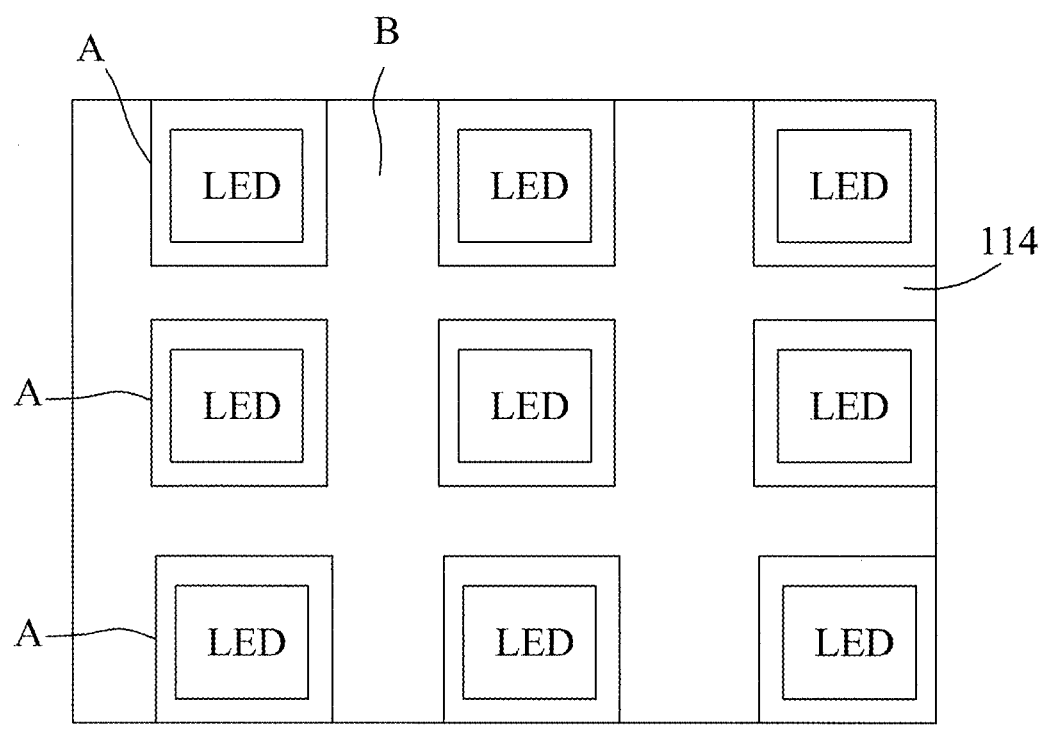
Figure 24:
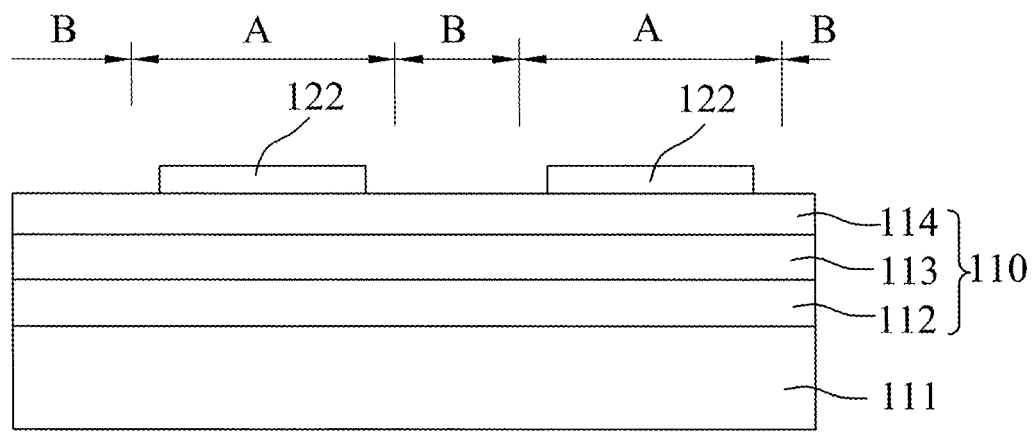
Figure 25:
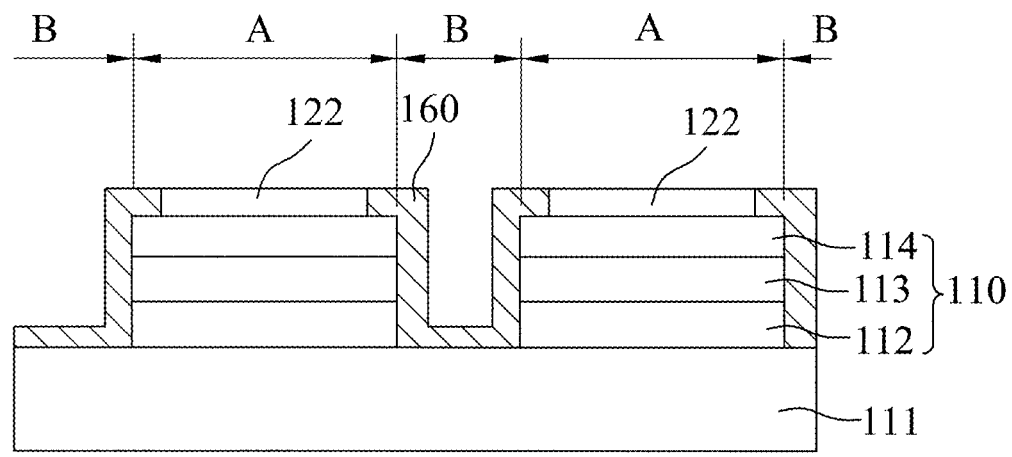

As shown in FIGS. 22 and 23, in step (a), the epitaxial layered structure 110 is provided on the temporary substrate 111.

The epitaxial layered structure 110 has a plurality of spaced apart micro-LED regions (A) that are arranged in an array and the cutting region (B) that surrounds and separates the micro-LED regions (A). The semiconductor surface of the first-type semiconductor layer 112 contacts the temporary substrate 111.

In this embodiment, step (b) includes sub-steps (b1') to (b4'). To be specific, referring to FIGS. 24 to 25, in sub-steps (b1') and (b2'), the second electrode 122 is formed on each of the micro-LED regions (A) on the second-type semiconductor layer 114 opposite to the light emitting layer 113 and the second-type semiconductor layer 114, the light emitting layer 113 and the first-type semiconductor layer 112 in the cutting region (B) are etched to expose the temporary substrate 111. Then, the insulating protective layer 160 covers the epitaxial layered structure 110 and the exposed temporary substrate 111 such that the second electrode 122 is exposed.

Figure 26:
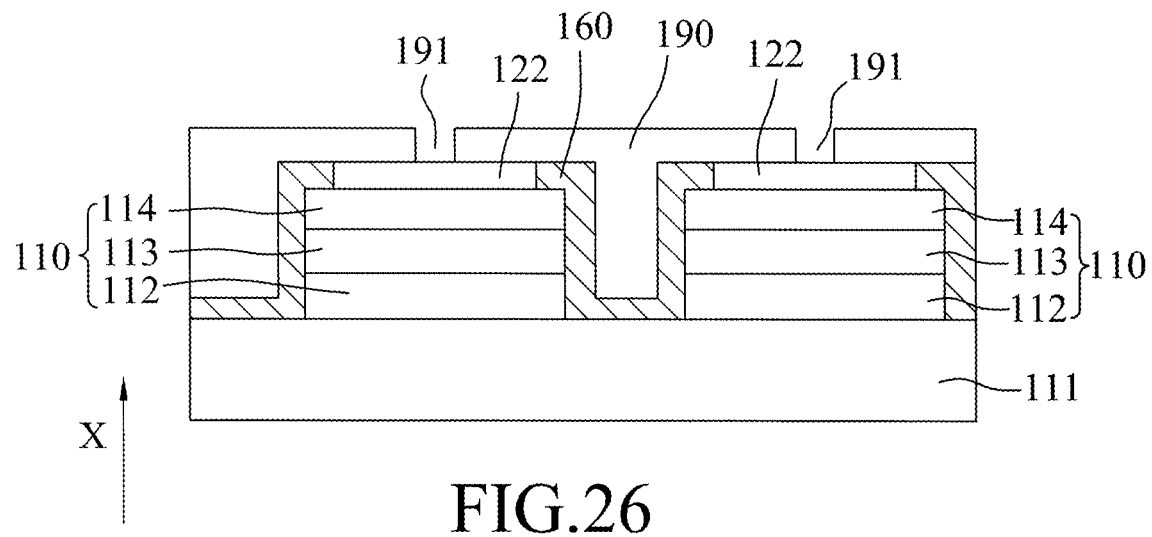

Thereafter, referring to FIG. 26, the sacrificial layer 190 is formed on the second electrode 122 on each of the micro-LED regions (A) in the laminating direction (X) and has through-holes 191 on each of the micro-LED regions (A) to expose the second electrode 122. The sacrificial layer 190 may have a thickness ranging from 0.1 µm to 5 µm, such as 2 µm to 4 µm. The sacrificial layer 190 may be made of a metal material (such as TiW), which not only have strong mechanical support, but also capable of directly serving as a test electrode for the micro-LED chips 100 to be made since the sacrificial layer 190 is electrically connected to the second electrode 122.

Figure 27:
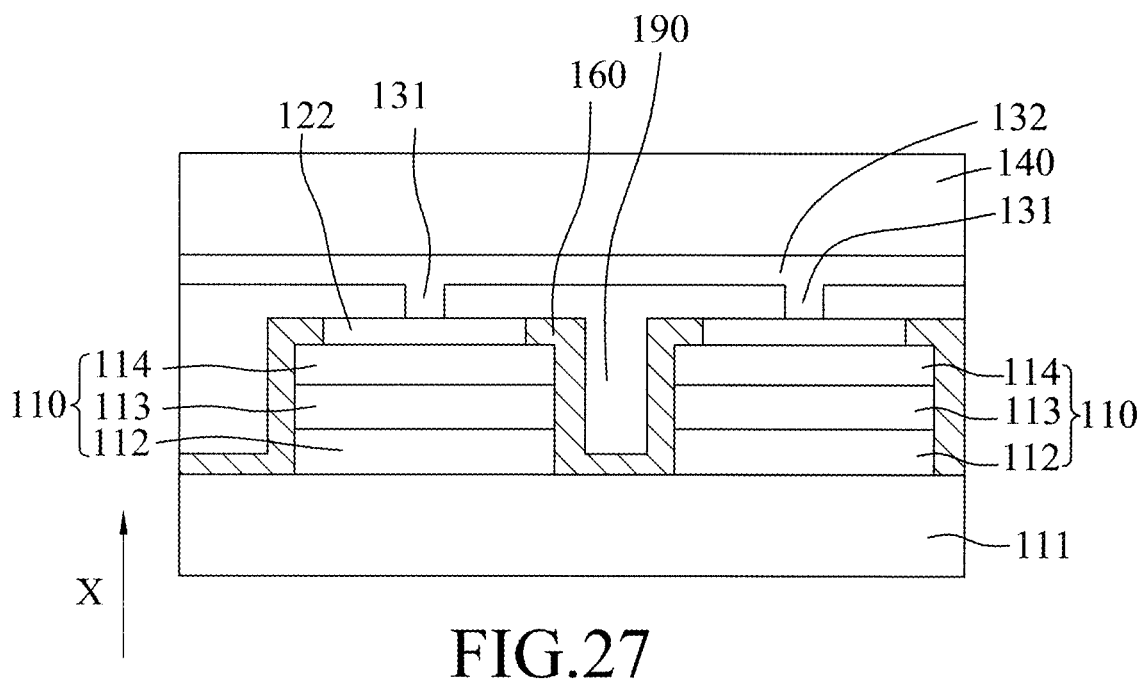

Referring to FIG. 27, the carrier substrate 140 is then provided to be spaced apart from the epitaxial layered structure 110 in the laminating direction (X), and the securing layer 132 is formed between the epitaxial layered structures 110 on each of the micro-LED regions (A) and the carrier substrate 140. The securing layer 132 fills each of the through-holes 191 of the sacrificial layer 190 to form supporters 131 that connect the epitaxial layered structures 110 on each of the micro-LED regions (A) to the carrier substrate 140.

Figure 28:
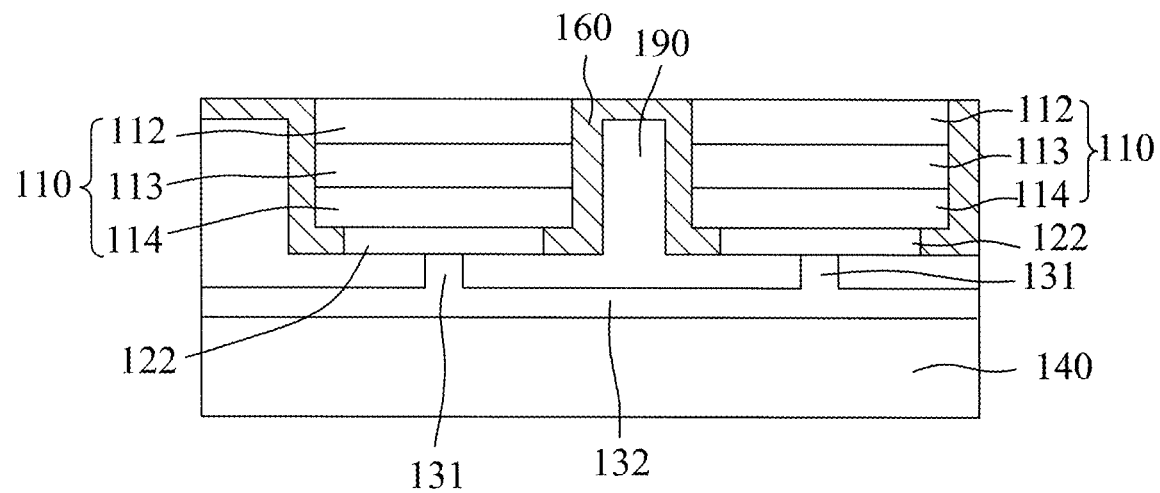
Figure 29:
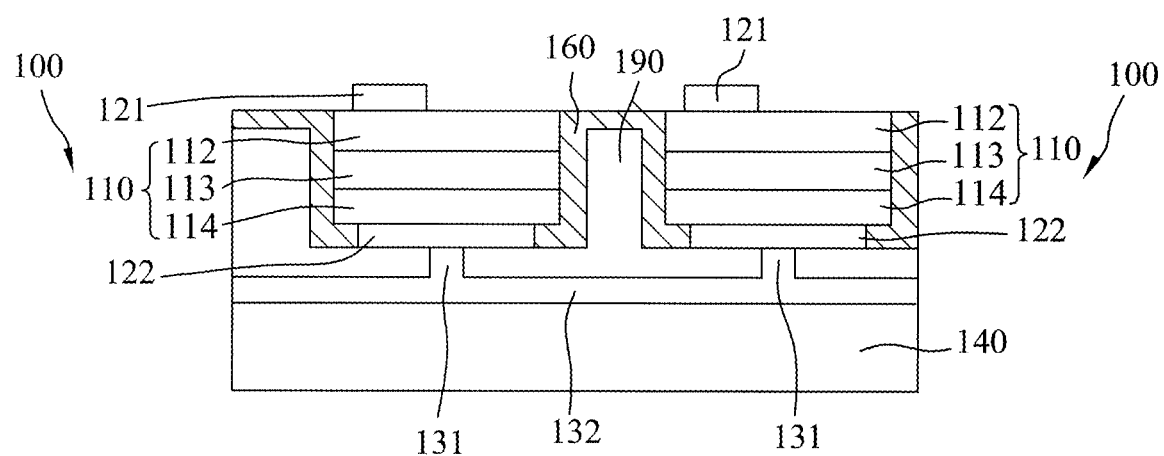

Referring to FIG. 28, in sub-step (b3'), the temporary substrate 111 is removed to expose the semiconductor surface of the first-type semiconductor layer 112 on each of the micro-LED regions (A). Then, in sub-step (b4'), on each of the micro-LED regions (A), the first electrode 121 is formed on the semiconductor surface of the first-type semiconductor layer 112, so as to obtain the plurality of the micro-LED chips 100 that are separated from one another (see FIG. 29).

Figure 30:
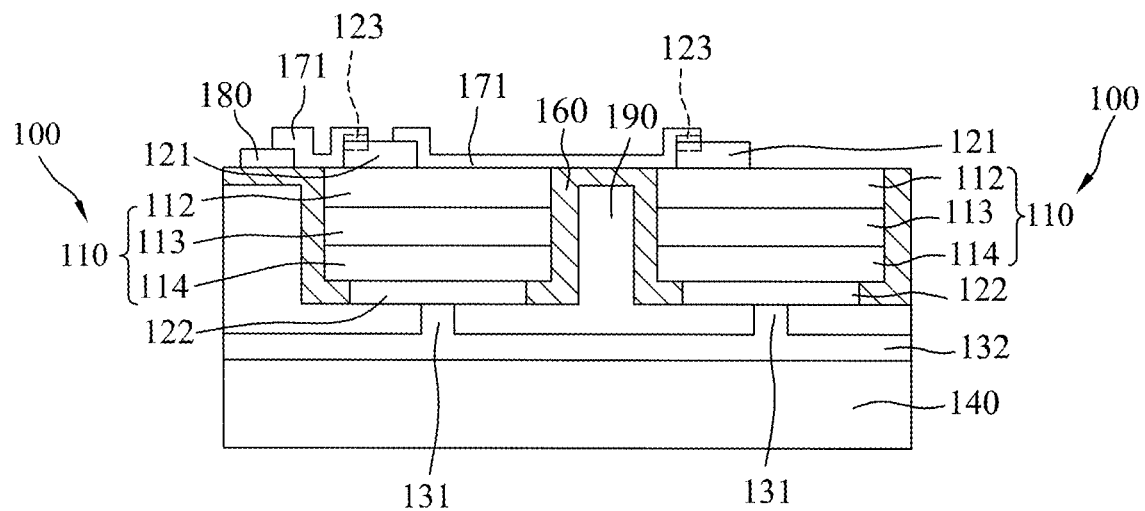

Referring to FIG. 30, the metal wire 171 is disposed on the wire connecting region 123 of the first electrode 121 of at least one of the micro-LED chips 100. The first electrode 121 is electrically connected to the test electrode unit 180 through the metal wire 171 so as to test the electrical and optical properties of the micro-LED chips 100. In addition, the first electrodes 121 of two adjacent ones of the micro-LED chips 100 may also be electrically connected through the metal wire 171.

In this embodiment, the metal wire 171 is made of a different material from that of the first electrode 121. For example, the metal wire 271 may be made of a material which can be removed by selective etching after the test of the electrical and optical properties of the micro-LED chips 100 is completed.

Figure 31:
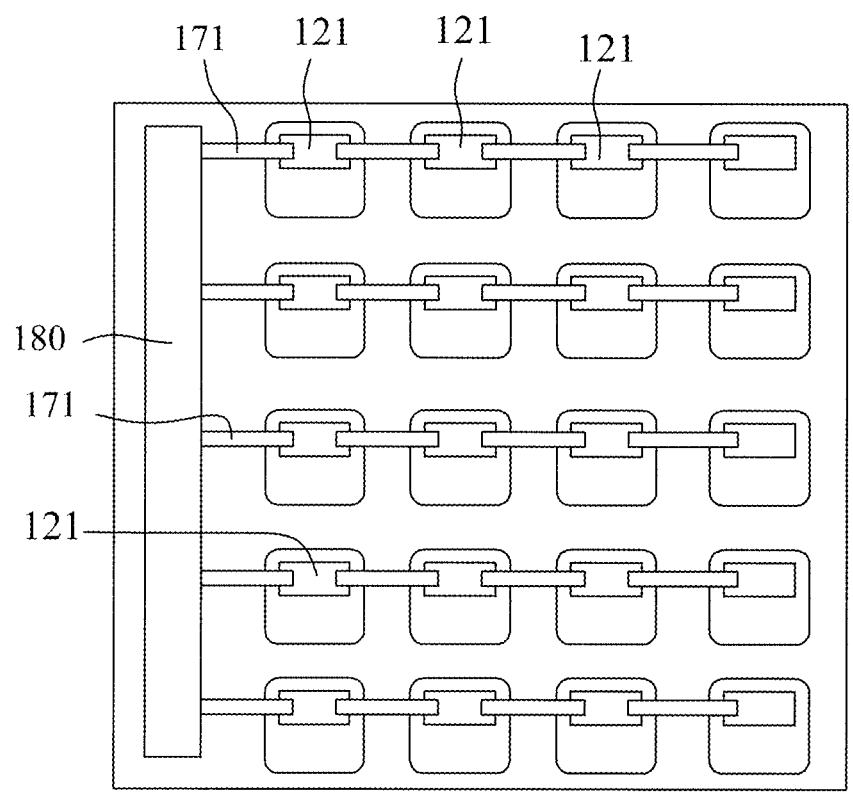

As shown in FIG. 31, the leftmost column of the micro-LED chips 100 are electrically connected to the test electrode unit 180 through the metal wire 171, and the micro-LED chips 100 on each row are interconnected through the metal wire 171. With such configuration, the test can be simply performed by electrically connecting a test device to the test electrode unit 180 (connecting to the first electrodes 121) and the sacrificial layer 190 (connecting to the second electrodes 122). It should be noted that the test electrode unit 180 may be connected to multiple micro-LED chips 100 as shown in FIG. 31, or may be connected to a single micro-LED chip 100. That is, the test electrode unit 180 can be connected to the first electrode 121 of one of the micro-LED chips 100, to the first electrodes 121 of two adjacent ones of micro-LED chips 100, or to the first electrodes 121 of four adjacent ones of the micro-LED chips 100, which is similar to the circuit design shown in FIG. 15.

Figure 32:
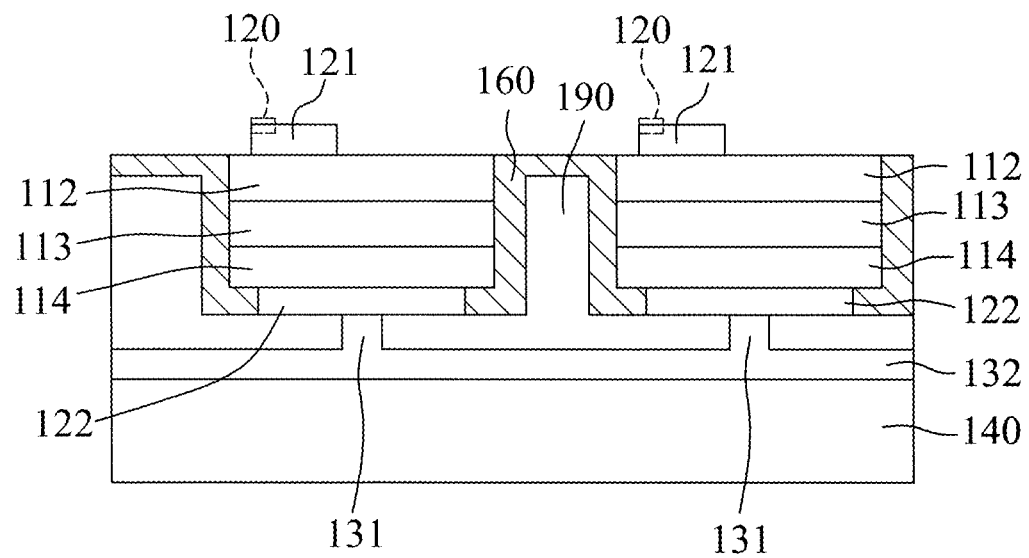
Figure 33:
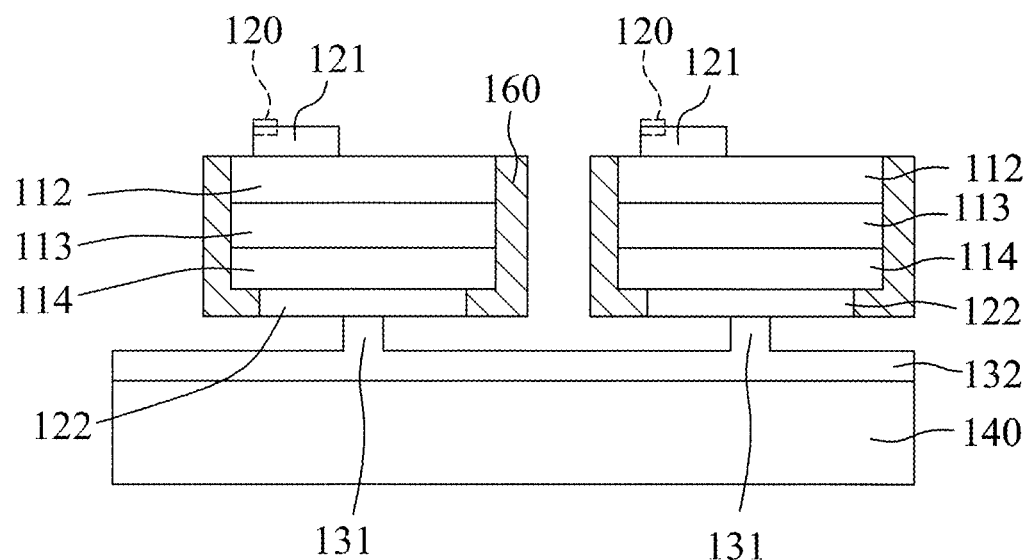

Referring to FIG. 32, the metal wire 171 is completely removed after the testing of the micro-LED chips 100 is completed, such that the wire connecting region 123 of the electrode surface of the first electrode 121 is formed into the first distinctive region 120 having a surface morphology different from that of the remaining region of the electrode surface of the first electrode. Alternatively, the metal wire 171 may be partially removed such that the metal wire 171 remaining on the wire connecting region 123 of the electrode surface of the first electrode 121 is formed as the first distinctive region 120 having a surface morphology different from that of the remaining region of the electrode surface of the first electrode 121.

Finally, the sacrificial layer 190 is removed such that the micro-LED chips 100 are supported on the carrier substrate 140 through the supporters 131.

To sum up, by virtue of providing the wire connecting region 123 on at least one of the first and second electrodes 121, 122 for the metal wire 171 disposed thereon to connect the micro-LED chips 100 to the test electrode unit 180, the electrical and optical properties of the micro-LED chips 100 can be readily tested and confirmed without interference from subsequent transfer of the array of the micro-LED chips 100.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A micro light emitting diode (micro-LED) chip, comprising:

an epitaxial layered structure including a first-type semiconductor layer, a second-type semiconductor layer, and a light emitting layer sandwiched between said first-type semiconductor layer and said second-type semiconductor layer;

a first electrode electrically connected to said first-type semiconductor layer; and a second electrode electrically connected to said second-type semiconductor layer, wherein said micro-LED chip has a first distinctive region on an electrode surface of said first electrode opposite to said first-type semiconductor layer, said first distinctive region having a surface morphology different from that of an adjacent region of said electrode surface of said first electrode, and wherein said first distinctive region is a region of said electrode surface of said first electrode and is formed by removal of a metal wire disposed on said first distinctive region, the metal wire being used to electrically connect said first electrode to a test electrode unit for testing the electrical and optical properties of said micro-LED chip.

2. The micro-LED chip of claim 1, wherein said first distinctive region has an area that is equal to or more than 5% of a total area of said electrode surface of said first electrode.

3. The micro-LED chip of claim 1, wherein:
said light emitting layer is disposed on said first-type semiconductor layer and is spaced apart from said first electrode; and
said micro-LED chip further has a second distinctive region on an electrode surface of said second electrode opposite to said first-type semiconductor layer, said second distinctive region having a surface morphology different from that of an adjacent region of said electrode surface of said second electrode.

4. The micro-LED chip of claim 3, wherein said second distinctive region is a region of said electrode surface of said second electrode and is formed by removing the metal wire disposed on said second distinctive region, said metal wire being used to electrically connect said second electrode to said test electrode unit for testing the electrical and optical properties of said micro-LED chip.

5. The micro-LED chip of claim 3, wherein said electrode surface of said second electrode has a wire connecting region, said micro-LED chip further including a metal wire that is formed on said wire connecting region and that is made of a material different from that of said second electrode, said metal wire formed on said wire connecting region of said electrode surface of said second electrode being formed as said second distinctive region of said micro-LED chip.

6. The micro-LED chip of claim 3, wherein said second distinctive region has an area that is equal to or more than 5% of a total area of said electrode surface of said second electrode.

7. The micro-LED chip of claim 1, wherein said first electrode is formed on a semiconductor surface of said first-type semiconductor layer that is opposite to said light emitting layer.

8. The micro-LED chip of claim 3, wherein said wire connecting regions of said first and second electrodes independently have a shape of one of polygon, circle and semi-circle.

9. The micro-LED chip of claim 1, wherein said micro-LED chip has a thickness that is equal to or smaller than 20 µm.

10. The micro-LED chip of claim 1, wherein said micro-LED chip has a size that is equal to or smaller than 100 µm×100 µm.

11. The micro-LED chip of claim 1, wherein a total area of a projection of said first electrode on said first-type semiconductor layer and a projection of said second electrode on said first-type semiconductor layer is not smaller than 40% of an area of a projection of said micro-LED chip on an imaginary plane parallel to said semiconductor surface of said first-type semiconductor layer.

12. The micro-LED chip of claim 1, wherein at least one of said first electrode and said second electrode has a supporter connecting region that is adapted for connecting to a supporter for pick-up operation.

13. The micro-LED chip of claim 12, wherein said supporter connecting region has an area that is equal to or smaller than 5% of an area of the corresponding one of said first electrode and said second electrode.

14. A method for manufacturing a micro light emitting diode (micro-LED) device including at least one micro-LED chip, comprising the steps of:
(a) providing an epitaxial layered structure that includes a first-type semiconductor layer, a light emitting layer and a second-type semiconductor layer which are sequentially disposed on one another in such order along a laminating direction;
(b) forming a first electrode electrically connected to the first-type semiconductor layer, and forming a second electrode electrically connected to the second-type semiconductor layer so as to obtain the micro-LED chip, the first electrode having an electrode surface that is opposite to the first-type semiconductor layer; and
(c) forming a first distinctive region on an electrode surface of the first electrode opposite to the first-type semiconductor layer, the first distinctive region having a surface morphology different from that of an adjacent region of the electrode surface of the first electrode,
wherein, the electrode surface of the first electrode has a wire connecting region, and step (c) further includes the following sub-steps of:
(c1) disposing a metal wire on the wire connecting region of the electrode surface, and electrically connecting the first electrode to a test electrode unit through the metal wire so as to test the electrical and optical properties of the micro-LED chip; and
(c2) after completing the test of the electric and optical properties, disconnecting the first electrode and the test electrode unit by removing at least a part of the metal wire between the first electrode and the test electrode unit.

15. The method of claim 14, wherein, in step (c2), the metal wire is completely removed such that the wire connecting region of the electrode surface of the first electrode is formed into a first distinctive region having a surface morphology different from that of the remaining region of the electrode surface of the first electrode due to the removal procedure.

16. The method of claim 14, wherein, in step (c2), the metal wire is partially removed such that the metal wire remains on the wire connecting region of the electrode surface of the first electrode, the metal wire remaining on the wire connecting region of the electrode surface of the first electrode being formed as a first distinctive region that has a surface morphology different from that of a remaining region of the electrode surface of the first electrode other than the wire connecting region.

17. The method of claim 14, further comprising step (d) of forming a securing layer that has at least one supporter connected to at least one of the first electrode and the second electrode.

18. The method of claim 14, wherein the metal wire is made of a metal material different from that of the first and second electrodes, and step (c2) includes removing the metal wire from the wire connecting region by selective etching to disconnect the first electrode and the test electrode unit.

19. The method of claim 14, wherein:
the micro-LED device includes a plurality of the micro-LED chips;
in step (a), the epitaxial layered structure is provided on a temporary substrate and has a plurality of spaced apart micro-LED regions that are arranged in an array and a cutting region that surrounds and separates the micro-LED regions;
in step (b), the light emitting layer is formed on a semiconductor surface of the first-type semiconductor layer and is spaced apart from the first electrode, and step (b) includes sub-steps of:

(b1) etching, in each of the micro-LED regions, a portion of the second-type semiconductor layer and a portion of the light emitting layer to expose the first-type semiconductor layer;

(b2) forming, in each of the micro-LED regions, the first electrode on the first-type semiconductor layer and forming the second electrode on the second-type semiconductor layer opposite to the light emitting layer; and (b3) etching the second-type semiconductor layer, the light emitting layer and the first-type semiconductor layer in the cutting region to expose the temporary substrate, so as to obtain the plurality of the micro-LED chips that are separated from one another; and in step (c1), the metal wire is disposed on the wire connecting regions of the first electrode of at least one of the micro-LED chips, and the first electrode of the at least one of the micro-LED chips is electrically connected to the test electrode unit through the metal wire.

20. The method of claim 19, wherein the metal wire is made of a metal material different from that of the first electrode, and is removed together with the test electrode unit by selective etching in step (c2).

21. The method of claim 14, wherein:

the micro-LED device includes a plurality of the micro-LED chips;

in step (a), the epitaxial layered structure is provided on a temporary substrate and has a plurality of spaced apart micro-LED regions that are arranged in an array and a cutting region that surrounds and separates the micro-LED regions, the first-type semiconductor layer having a semiconductor surface that is opposite to the light emitting layer and that contacts the temporary substrate;

step (b) includes sub-steps of:

(b1') etching, the second-type semiconductor layer, the light emitting layer and the first-type semiconductor layer in the cutting region to expose the temporary substrate;

(b2') forming, on each of the micro-LED regions, the second electrode on the second-type semiconductor layer opposite to the light emitting layer;

(b3') removing the temporary substrate to expose the semiconductor surface of the first-type semiconductor layer; and (b4') forming, on each of the micro-LED regions, the first electrode on the semiconductor surface of the first-type semiconductor layer so as to obtain the plurality of the micro-LED chips that are separated from one another; and in step (c1), the metal wire is disposed on the wire connecting region of the first electrode of at least one of the micro-LED chips, and the first electrode of the at least one of the micro-LED chips is electrically connected to the test electrode unit through the metal wire.

22. The method of claim 14, further comprising after step (c1), the steps of:

forming a sacrificial layer on the second electrode of each of the micro-LED chips in the laminating direction, the sacrificial layer having through-holes formed on each of the micro-LED chips to expose the second electrode;

providing a carrier substrate that is spaced apart from the epitaxial layered structure in the laminating direction, and forming a securing layer between the epitaxial layered structures of the micro-LED chips and the carrier substrate, the securing layer filling each of the through-holes of the sacrificial layer to form supporters that connect the epitaxial layered structures of each of the micro-LED chips to the carrier substrate; and removing the sacrificial layer.

23. The method of claim 22, wherein the metal wire and the sacrificial layer are made of a same metal material that is selected from TiW and Ni, and are simultaneously removed.

24. The method of claim 14, wherein the metal wire is made of a metal material different from that of the first electrode, and is removed together with the test electrode unit by selective etching in step (c2).

* * * * *